United States Patent [19]

Gulbranson et al.

[11] Patent Number: 5,161,986

[45] Date of Patent: Nov. 10, 1992

[54] LOW INDUCTANCE CIRCUIT APPARATUS WITH CONTROLLED IMPEDANCE CROSS-UNDERS AND CONNECTOR FOR CONNECTING TO BACKPANELS

[75] Inventors: Glenn J. Gulbranson, Burnsville; Steven J. Young, Excelsior; Gerald W. Kenealey, Minneapolis, all of Minn.

[73] Assignee: Ceridian Corporation, Minneapolis, Minn.

[21] Appl. No.: 776,818

[22] Filed: Oct. 15, 1991

[51] Int. Cl.[5] .......................................... H01R 13/643
[52] U.S. Cl. ...................... 439/92; 439/493; 439/610
[58] Field of Search ............ 439/65, 67, 77, 92, 439/493, 607, 610

[56] References Cited

U.S. PATENT DOCUMENTS 4,971,574  11/1990  Garcia ................................. 439/610
5,094,623  3/1992   Scharf et al. ....................... 439/607

Primary Examiner—Joseph H. McGlynn
Attorney, Agent, or Firm—Kinney & Lange

[57] ABSTRACT

Circuit apparatus comprises an integral structure of first and second multilayer wiring board portions and a flexible circuit portion. The wiring board portions each have at least circuit trace planes, ground planes and insulator planes. The flexible circuit portion includes at least one signal trace plane and at least one ground plane separated by at least one insulator plane; the singal trace plane of the flexible circuit portion being integral with a signal trace plane of each of the wiring board portions, the ground plane of the flexible circuit portion being integral with a ground plane of each of the wiring board portions, and the insulator plane of the flexible circuit portion being integral with an insulator plane of each of the wiring board portions. Selected ones of a plurality of electric contacts are connected to selected ones of the circuit traces of the circuit trace plane of the flexible circuit portions; others of the contacts being connected to the ground plane. A pin connector is conenected to the plurality of contacts and is arranged to electrically connect selected circuits traces and the ground plane of the flexible circuit portion to an interconnect backpanel, thereby electrically connecting the wiring board portions to the backpanel with minimum inductance.

16 Claims, 5 Drawing Sheets

LOW INDUCTANCE CIRCUIT APPARATUS WITH CONTROLLED IMPEDANCE CROSS-UNDERS AND CONNECTOR FOR CONNECTING TO BACKPANELS

BACKGROUND OF THE INVENTION

This invention relates to low inductance circuit apparatus, and particularly to circuit apparatus having connectors for connecting wiring boards to a backpanel. More particularly, the invention relates to a rigid/flex wiring board with a connector connecting the flex portion to a backpanel.

Prior circuit connection arrangements formed inductive loops in the signal paths in circuits between separate printed wiring boards connected by backpanels. The loop areas can be approximated by the cross-sectional area formed by the physical length and separation of a signal path from its ground return path. These loops form inductive reactances which, at high frequencies, deteriorate signals in the signal paths and induce undesirable voltages in the ground planes. The inductance is proportional to the area of the loop made by the current flow; a larger loop forming a greater inductance, hence more adversely deteriorating signals in the signal paths at a given frequency. Induced signals in the ground plane create undesirable ground shift.

In digital electronics employing pulse signals with "square" profiles, it is important to maintain sharp rise and fall times to the pulse signal. However, inductive loops tend to lengthen the rise and fall times, thereby deteriorating the quality of the pulse signal. To minimize deterioration of signals in the signal paths of printed wiring boards and backpanel interconnections, it is desirable to maintain the inductive loop as small as possible.

Another problem with prior flex circuits is that the mechanical connection between the flex circuit and the rigid wiring boards resulted in unacceptable impedances in the signal paths, causing deterioration of the signals in the signal paths.

The quality and symmetry of the ground pin assignment across the connector interface is a major factor in determining effective connector inductance. Marginal grounding will cause ground shift, especially at unswitched outputs, resulting in deterioration of signals and erroneous data transfer. Accordingly, it is important to consider the ground pin assignment to minimize ground shift.

Young U.S. Pat. No. 4,755,147, issued Jul. 5, 1988 and assigned to the same assignee as the present invention, describes a flexible wiring circuit (flex circuit) having a circuit trace plane and a ground plane. The circuit trace plane includes a plurality of circuit traces, some of which extend between logic trace holes in the circuit trace plane and leads connected to one or the other of two rigid wiring boards. Others of the circuit traces connect between leads connected to each rigid wiring board to provide signal paths between the two wiring boards. The logic trace holes are arranged to connect to individual pins of a pin connector for input/output to a backpanel. The ground plane includes a plurality of ground plane holes for connection to other individual pins of the pin connector. The ground plane is separately connected to individual leads connected to each rigid wiring board. The leads connecting the ground plane and circuit traces to the rigid wiring boards are solder connected to individual pads on the respective wiring board. The backpanel provides interconnection to the pins of the connector in a manner dictated by the circuit traces and configurations of the backpanel.

The flex circuit and connector described in the Young patent provided a substantial advance in flex circuit connectors. The pattern of ground connection pins between the pin connector and ground plane in the Young patent was such as to reduce impedance mismatch between circuits on the rigid wiring boards and circuits on the backpanel, and to reduce inductance between the ground plane of the flex circuit and the ground of the backpanel thereby reducing local ground potential shifts when operating circuits.

Although the Young patent optimized the loop size in the flexible circuit interconnection between each wiring board and the backpanel, the Young approach did not fully optimize loop size through the connection between wiring boards, nor to the wiring boards themselves. Moreover, the Young arrangement continued to exhibit problems with high frequency inductance and ground shifts. The solder connection of the leads to the pads on the rigid wiring boards created impedance mismatch, particularly in the ground plane connection. The use of the leads to connect the ground plane to pads on the rigid circuit boards limited the space available for signal trace connections to the wiring boards, thereby limiting the input/output connections to the backpanel and the number of crossunder connectors between boards. While this latter drawback could be reduced by simply dedicating more leads to signal traces and less to ground connections, such a solution diminished the integrity of the ground connections. Further, the use of the connection holes in the individual ground and signal trace planes of the flex circuit, together with solder connections to the pins of the pin connector, effectively limited the backpanel connection through the pin connector to only two planes on the flex circuit: the ground plane and the single signal trace plane. Hence, the Young patent could not accommodate a power plane, nor more than one signal trace plane.

SUMMARY OF THE INVENTION

The present invention is directed to a rigid/flex printed wiring board comprising an integral structure of at least first and second multilayer wiring board portions connected together by an integral flexible circuit portion. The wiring board portions each have at least circuit trace planes and ground planes, and usually power planes, separated by insulator planes. The flexible circuit portion includes at least one signal trace plane and at least one ground plane separated by at least one insulator plane; the signal trace plane of the flexible circuit portion being integral with a signal trace plane of each of the wiring board portions, the ground plane of the flexible circuit portion being integral with a ground plane of each of the wiring board portions, and the insulator plane of the flexible circuit portion being integral with an insulator plane of each of the wiring board portions. Selected ones of the circuit traces of the flexible circuit portion are connected to selected ones of a plurality of electric contacts; others of the contacts being connected to the ground plane and/or power plane of the flexible circuit portion. A mating connector connects the plurality of contacts to a backpanel.

The mating connector may be a plug-type connector, or a pressure-type connector. The connector electrically connects the wiring board portions to input/output connections of a backpanel, with small signal loops and minimum inductance.

Additional signal trace and ground planes may be added to the flexible circuit portion, and the flexible circuit portion may also include a power plane.

DETAILED DESCRIPTION OF THE PREFERRED EMBODIMENTS

Figure 1:
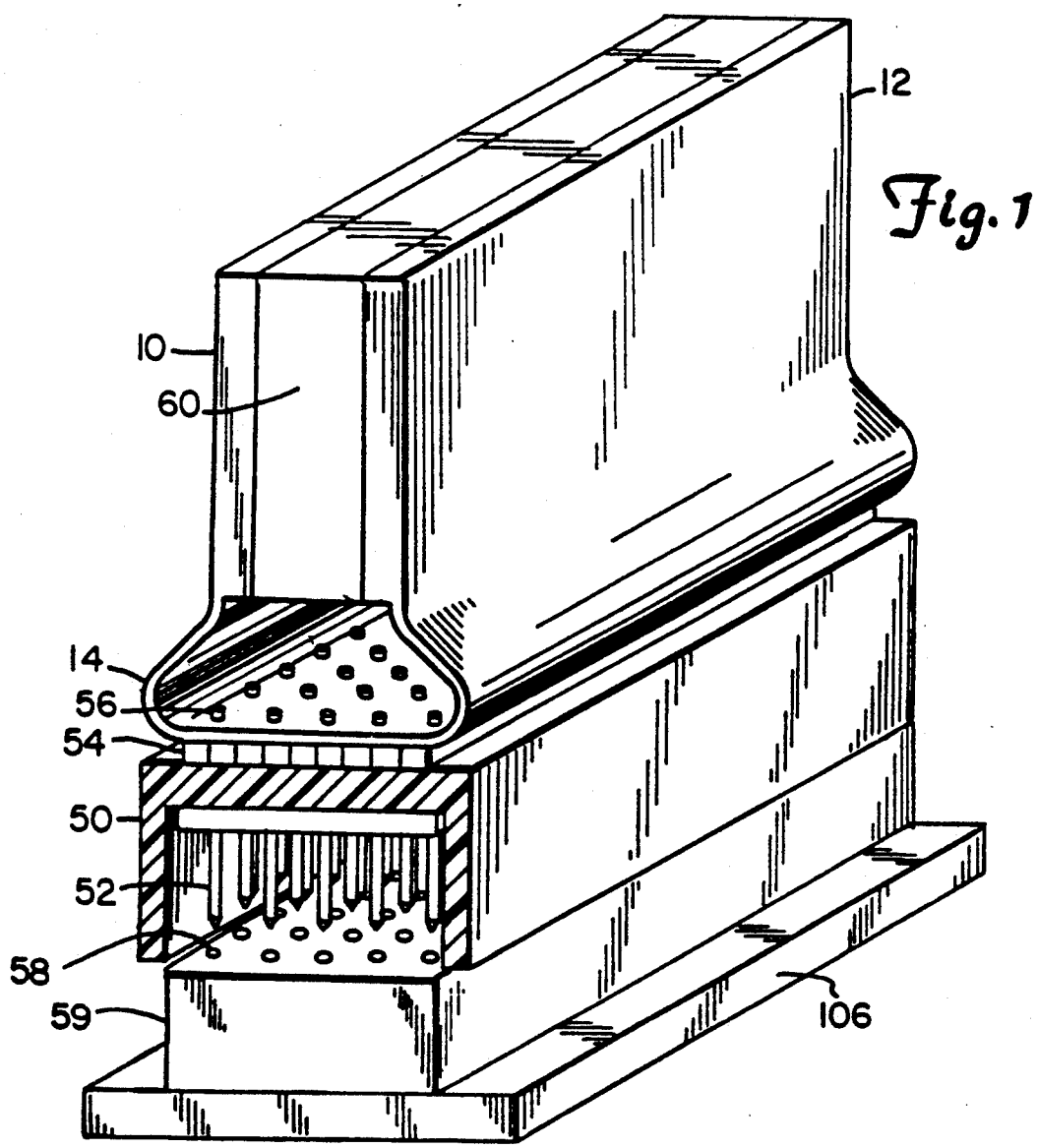
FIG. 1 is a perspective view, in cutaway cross-section, of a portion of a rigid/flex printed wiring board and connector in accordance with the presently preferred embodiment of the present invention.
Figure 2:
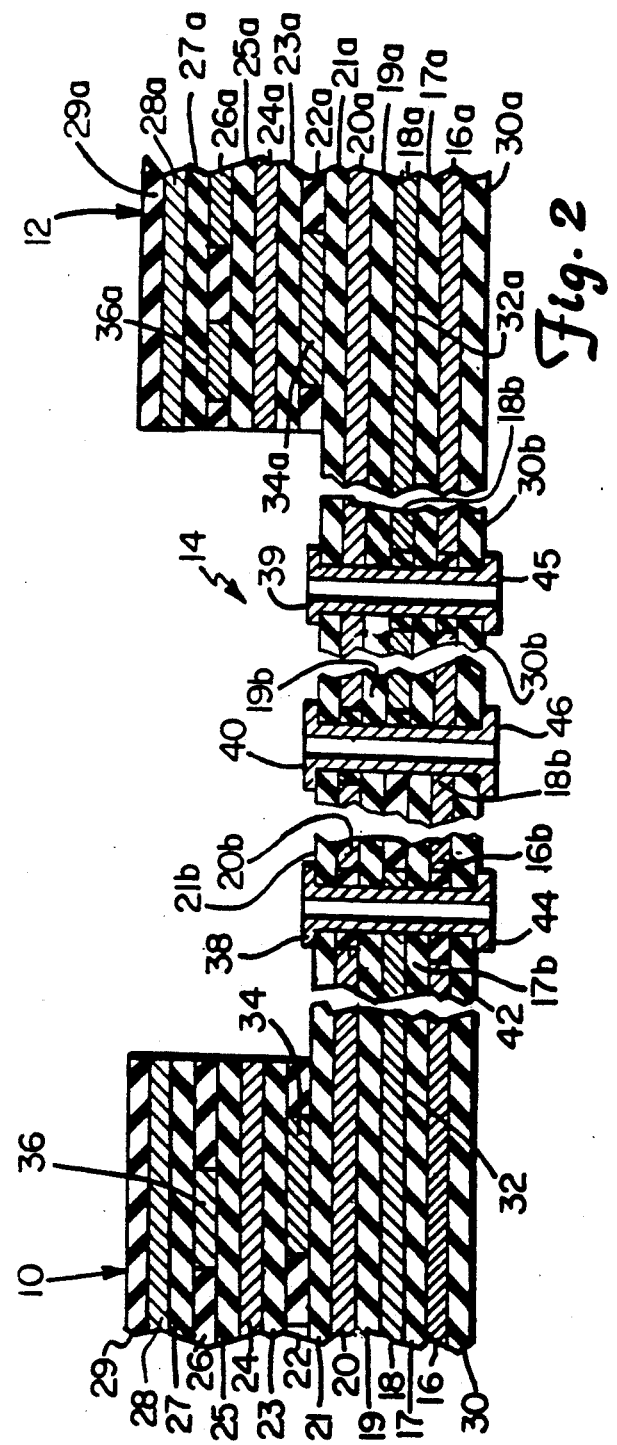
FIG. 2 is a section view of a portion of the rigid/flex printed wiring board illustrated in FIG. 1.

FIG. 1 is a perspective view, partly in cutaway cross-section, of a rigid/flex printed wiring board and connector in accordance with the preferred embodiment of the present invention. The rigid/flex printed wiring board comprises a pair of rigid multilayer wiring board portions 10 and 12 connected by integral flexible circuit portion 14. Wiring board portions 10 and 12 and flexible circuit portion 14 are fabricated together as illustrated in FIG. 2. Multilayer wiring board portion 10 includes a plurality of planes, including ground plane 16, signal trace plane 18, ground plane 20, signal trace plane 22, ground plane 24, signal trace plane 26 and signal trace plane 28. Each of the planes is separated by an insulator plane 17, 19, 21, 23, 25 and 27. Optionally, upper and lower insulating caps 29 and 30 may be disposed over the top signal trace plane 26 and bottom ground plane layer 16. Signal trace planes 18, 22, 26 and 28 include signal traces, such as traces 32, 34 and 36 typical of a printed wiring board. Signal trace planes 18, 22, 26 include insulation in the regions outside of the conductive signal traces, the insulation may be part of an adjacent insulation layer, or may be distinct therefrom. Multilayer board portion 12 is similar in construction to multilayer board portion 10 and like parts are designated with like reference numerals followed by the designation "a".

Flexible circuit portion 14 is integral with certain of the layers forming multilayer wiring board portions 10 and 12. As shown in FIG. 2, flexible circuit portion 14 includes at least a ground plane 16b and a signal trace plane 18b separated by an insulation 17b. Additional signal trace and/or ground planes may also be includes, such as signal trace plane 20b shown in FIG. 2. Optionally, caps 21b and 30b enclose the flexible circuit portion and are constructed of a suitable insulator material, cap 21b being conveniently formed of the same layer as insulation layer 21, 21a. Plated-through holes 38 and 40 provide electrical connection between selected signal traces of signal trace plane 18b and ground plane 16b to external surface 42 of the flexible circuit portion. For example, plated-through hole 38 may be connected to signal trace 32 of signal trace plane 18 and plated-through hole 40 may be connected to ground plane 16b. Plated-through hole 39 provides similar connection for a trace on plane 20b, if provided. In all cases, the plated-through holes provide independent electrical connection to vias 44–46 adjacent surface 42.

Optionally, board portions 10 and 12 and flexible portion 14 may also include power planes in addition to the ground and signal trace planes. For example, plane 20, 20a, 20b may be a power plane carrying power to and between rigid boards and 12. Also optionally, boards 10 and 12 may include semiconductor planes to form active circuit elements in addition to wiring patterns. While flexible portion 14 could also include semiconductor elements, such an arrangement would probably not be desirable in most cases.

Multilayer wiring board portions 10 and 12 comprise a plurality of planes, or layers of material, and are relatively rigid due to the relatively high number of layers (as compared to flexible circuit portion 14). Board portions 10 and 12 may comprise any convenient number or configuration of signal trace planes, ground planes and insulator planes, as well as optional power planes, as is well known in the art. On the other hand, flexible circuit portion 14 is relatively flexible due to the relatively low number of layers. Typically, flexible circuit portion will contain no more than about seven signal, ground and power planes given existing technology.

FIG. 1 illustrates the pin connector having connector housing 50 supporting insulator bushings 54 which in turn support a plurality of pin contacts 52. Alternatively, housing 50 may be constructed of suitable insulator material and pin contacts 52 may be press-fitted therein, thereby eliminating the bushings. Pin contacts 52 extend though and are connected to plated through holes 38–40, and extend through the flexible circuit portion 14, as at 56. Contacts 52 are arranged to engage connector apertures 58 in connector 59 connected to backpanel 106. Backpanel 106 includes interconnections to input and output signals. Ground planes and power planes in the flexible circuit are also connected through connector 50, 59 to similar planes in backpanel 106. The connector provides input/output connection between backpanel 106 and flexible circuit portion 14.

Flexible circuit portion 14 is folded to form a loop, as shown in FIG. 1. Multilayer wiring board portions 10 and 12 are mounted to sandwich heat sink 60 between portions 10 and 12. The arrangement is such that the surfaces formed by cap 28 and 28a directly abut opposite planar surfaces of heat sink 60. Alternatively, caps 30 and 30a may abut heat sink 60. A housing or other support structure may be employed instead of or in addition to heat sink 60.

Figure 3A:
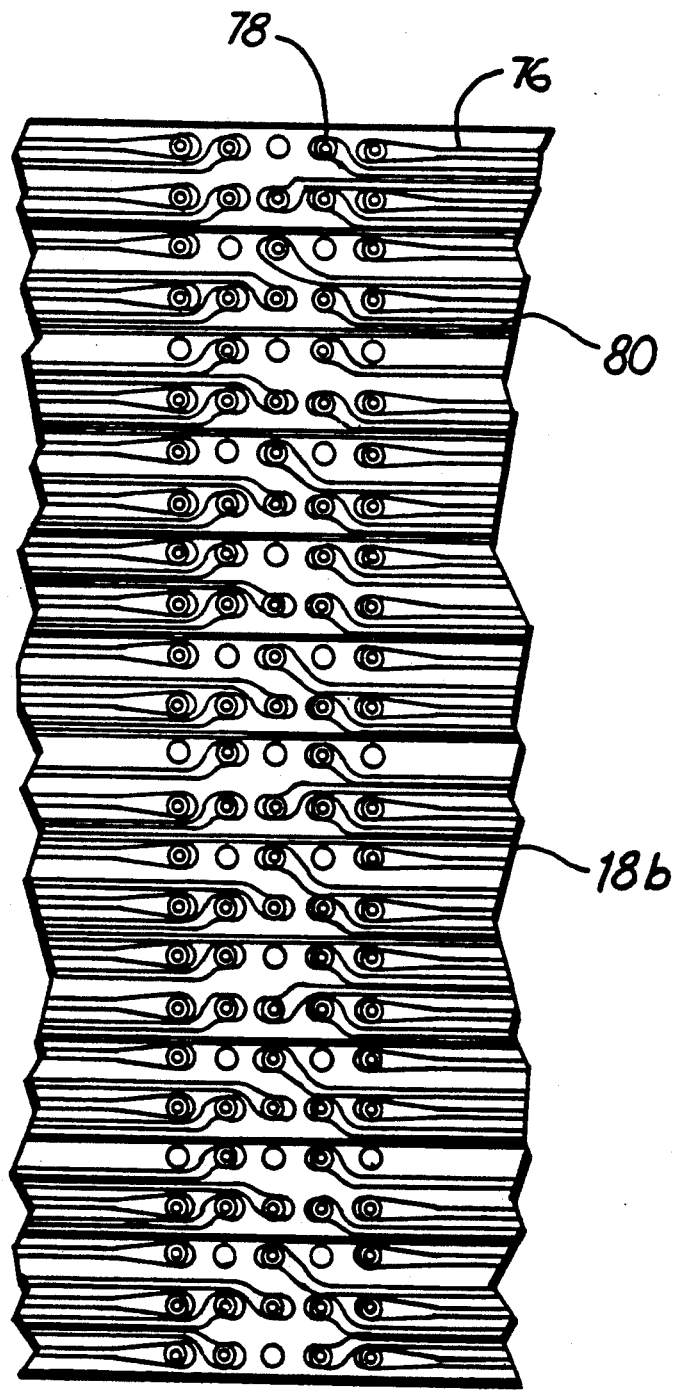
FIGS. 3A and 3B are plan views of a portion of different layers of the flexible circuit portion of the rigid/flex printed wiring board illustrated in FIG. 2.
Figure 3B:
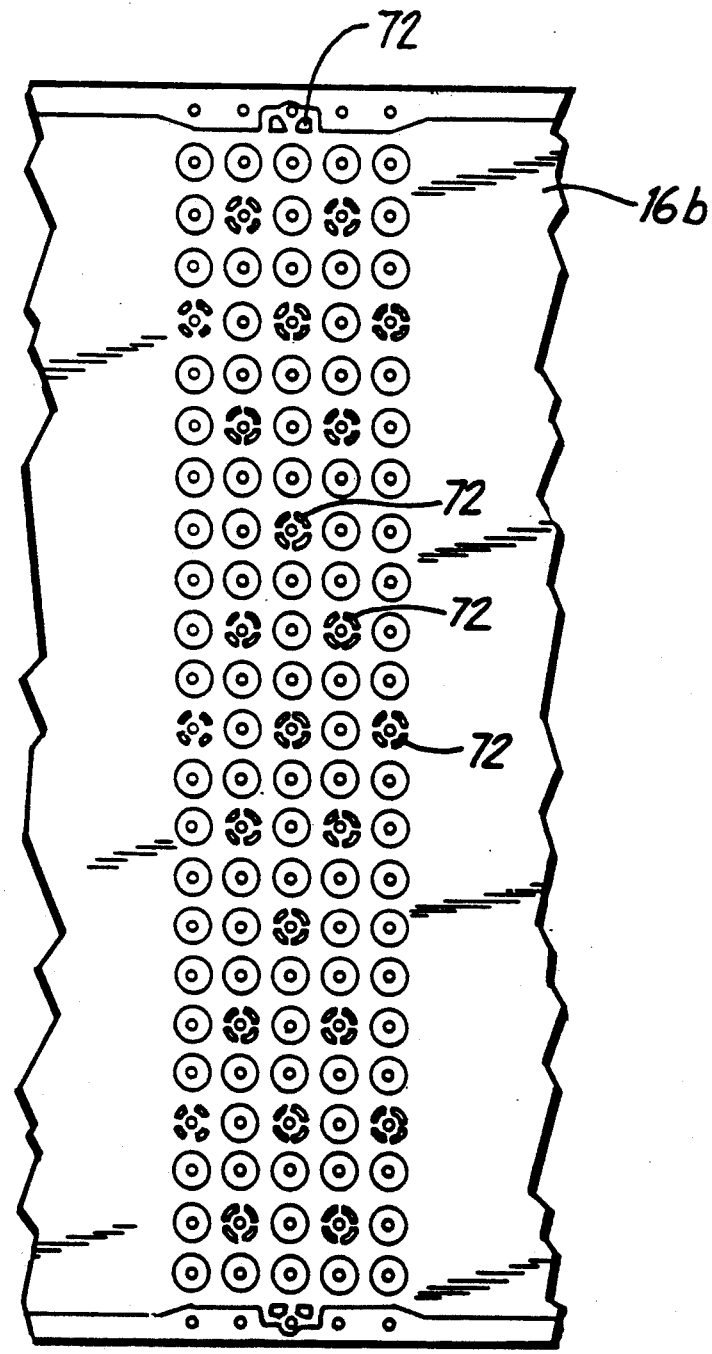

FIGS. 3A and 3B illustrate typical configurations for the circuit trace and ground planes of flexible circuit portion 14. For purposes of explanation, a row will consist of the five plated-through holes corresponding to the pins illustrated in FIG. 1. It is to be understood that other configurations may be employed without departing from the spirit of the present invention. The rows of plated-through holes are disbursed across portion 14 between the edges of the integral printed wiring board portions 10 and 12 between a first row and a last row at the top and bottom, respectively, of FIGS. 3A and 3B.

FIG. 3A illustrates the signal trace pattern of the signal trace layer 18b for the flexible circuit portion 14 shown in FIGS. 1 and 2. The signal traces may be formed using stripline or microstrip technology. Electrically conductive signal traces are formed on an insulator layer, such as the insulator layer directly adjacent the trace. Some traces 76 are connected to unique ones of plated-through holes 78 and extend to one or the other of multilayer board portions 10 and 12. Other signal traces 80 connect through to both wiring board portions without connection to a plated-through hole. In addition, signal traces may be provided which connect a unique plated-through holes to both wiring board portions. To accommodate the radius of the loop formed by the flexible circuit portion, the signal traces of the signal trace layer are preferably formed of a pliable conductive metal, such as copper or a beryllium/copper alloy, and the insulative layers are also formed of a reasonably pliable material, such as polyimide.

FIG. 3B illustrates the ground plane layer 16b of the flexible circuit portion, constructed of a suitable conductive material, such as copper, beryllium/copper or gold. Ground plane 16b is connected to plated-through holes 72 in alternate rows, commencing with the first row, and is insulated from the other plated-through holes, as described above. In the first row ground plane 70 is connected to a plated-through holes 72 in the third position. In the third row ground plane 70 is connected to plated-through holes 72 in the second and fourth positions. In the fifth row ground plane 70 is connected to the first, third and fifth positions; in the seventh row to the second and fourth positions; in the ninth row to the third position; and so on, alternating between the odd and even numbered positions in alternate rows as in rows three, five and seven.

The insulator material surrounding unconnected plated-through holes in FIG. 3B may conveniently be formed by predrilling, etching or masking (in the case of deposition) during the formation of the flexible circuit portion so that upon application of the adjacent insulator layer the resulting hole is occupied by insulator material. During the subsequent drilling process for forming the plated-through holes, the holes do not make contact with the conductive material forming layers 16b wherever insulated.

The ground pin assignment pattern illustrated in FIG. 3B is illustrative of a suitable ground pin assignment pattern for bipolar or CMOS logic. A single ground pin may accommodate up to about six signal paths (signal-to-ground pin ratio of 6:1). For faster GaAs logic (where signal edge rates are less than one nanosecond), it may be desirable to employ signal-to-ground pin ratios of between about 2:1 and 1:1. It is important that the ground pin assignment pattern be symmetrical for effective grounding, and that preferably the signal pins are always adjacent a ground pin.

One feature of the present invention resides in the signal trace plane of FIG. 3A. Particularly, by controlling the width and thickness of the signal traces and the thickness and dielectric characteristics of the insulator material, the impedances of the traces can be accurately controlled and selected and induction in the signal paths accurately controlled. Since the signal traces are integral with those of the rigid multilayer board portions, there is no mechanical connector to generate an impedance mismatch between board portions. Hence, the invention permits a more reliable impedance determination.

In the construction and assembly of the circuit assembly illustrated in FIG. 1, the rigid/flex circuit comprising multilayer wiring boards 10 and 12 and integral flexible circuit portion 14 are fabricated using techniques well known in the art. The rigid/flex circuit is arranged in a flat position and the connector assembly of FIG. 1 is assembled thereto. More particularly, the pins of the connector assembly are inserted through the plated-through holes to fasten the connector to the rigid/flex circuit. Thereupon, the flexible circuit portion is bent into the loop shown in FIG. 1 and rigid multilayer wiring boards 10 and 12 are mounted to heat sink or structure 60. One feature of the invention of FIG. 1 resides in the fact that the rigidity of the connector assembly maintains the flexible circuit portion rigid at the interface with the connector assembly. This serves to support the plated-through holes, as well as the circuit traces and planes, to prevent damage due to stress when bending flexible circuit portion 14.

Figure 4:
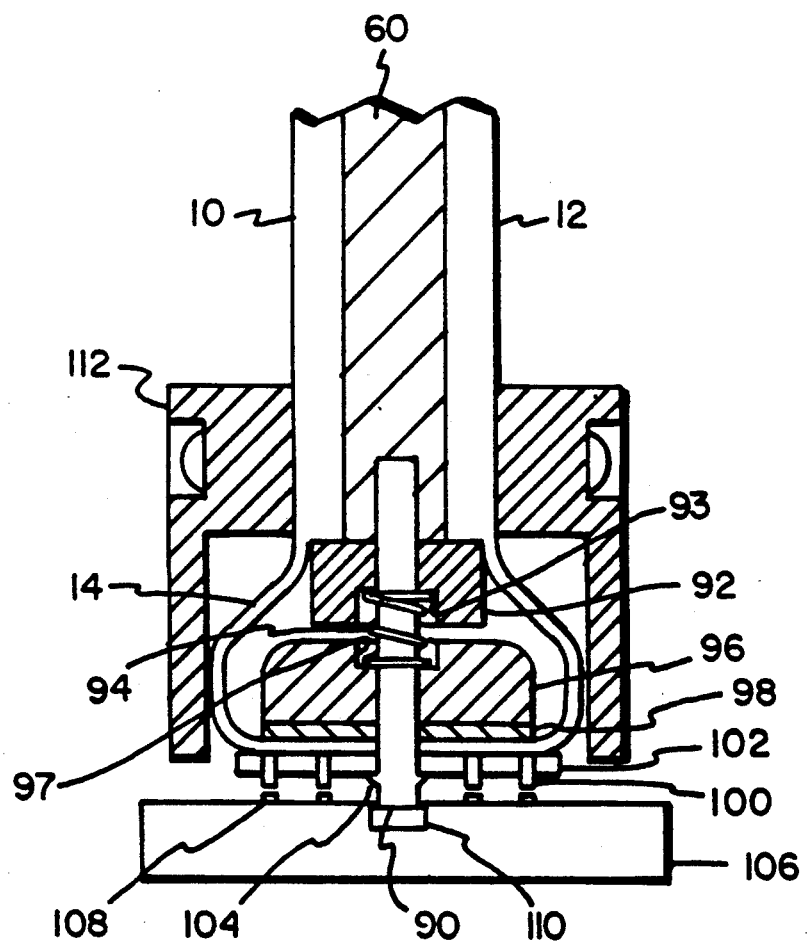
FIG. 4 is a section view of a rigid/flex printed wiring board and connector in accordance with another embodiment of the present invention.

FIG. 4 illustrates a modification of the connector for input/output between backpanel 106 and flexible portion 14. The connector illustrated in FIG. 4 provides a shortest path length from the flexible circuit portion to the backpanel, thereby further minimizing ground inductance caused by loop area of the interconnection. Wiring board portions 10 and 12 are mounted to heat sink 60 as described in connection with FIG. 1. Shafts 90 are arranged along the length of the assemblage and are fixed at one end to heat sink 60. Support plate 92 is fixed to shafts 90 at an edge of the boards/heat sink assembly. Support plate 92 includes recess 93 receiving one end of compression springs 94. Plate 92 is positioned in the loop formed by flexible circuit portion 14 and is attached to heat sink 60. Pressure plate 96 includes recess 97 receiving the other end of springs 94. Elastomer 98 is sandwiched inside the loop and is attached to pressure plate 96 and flexible circuit portion 14 adjacent plated-through holes 38, 40. Shafts 90 extend through plate 96, elastomer 98, flexible circuit portion 14 and support plate 102 Plate 102, which is an insulator material, supports compressible button contacts 100, arranged to engage contacts 108 on backpanel 106. Compression springs 94 are arranged to bias plate 96 downwardly from plate 92. Flanges 104 on shafts 90 are arranged to react against plate 102 to thereby form a downward limit for travel of the pressure plate/flexible circuit portion assembly. Recess 110 in backpanel 106 is arranged to receive the ends of shafts 90 to align contacts 100 on the connector to contacts 108 on the backpanel. Housing 112 is mounted to board portions 10 and 12 and/or to heat sink 60 to enclose the connector assembly. The backpanel preferably includes a heat sink arranged to engage shafts 90 to provide additional conduction of heat from boards 10 and 12.

The connector shown in FIG. 4 operates to connect circuits of printed wiring board portions 10 and 12 to backpanel 106. Springs 94 provide a continuous bias force to positively engage compressible button contacts 100 to contacts 108 on backpanel 106. Elastomer 98 provides proper pressure distribution of the bias force to the button contacts.

The circuit assembly of FIG. 4 is assembled by mechanically bending the flexible circuit portion 14 into the shape shown in FIG. 4, but omitting the support or heat sink 60. Pressure plate 96 and elastomer 98 are inserted into the opening between wiring boards 10 and 12, and support plate 102 and button contacts 100 are positioned so that the button contacts attach to the plated-through holes in flexible circuit portion 14. Shafts 90 and springs 94 are positioned in respect to the assemblage as shown. Plate 92 is fastened to heat sink or support 60 and that assembly is positioned over shafts 90 as shown. Boards 10 and 12 are then brought into supporting abutment to support or heat sink 60, and housing 112 is assembled to the unit to complete the assembly. Unlike the connector of FIG. 1, the connector of FIG. 4 does not support flexible circuit portion 14 with the connector body during folding of the rigid/flex circuit. Nevertheless, the flexible circuit portion is sufficiently flexible and rugged to withstand injury during folding.

Prior to the present invention, the interconnect backpanel provided the primary connection of the signal traces connected to circuit portions 10 and 12. The present invention eliminates routing signal trace connections through the backpanel by providing a continuous signal trace connection between the pair of multilayer wiring board portions. The ground plane is continuous and integrally connected, as is a power plane, if provided. Hence, impedance mismatch at the connection is eliminated, as is electrical noise and ground shift due to marginal grounding. The loop formed by the flexible circuit portion should be as small as possible, and only large enough to accommodate the contacts for the connector. The continuous signal traces through the flexible circuit portion 14 between board portion 10 and board portion 12 assure minimal signal path lengths. The provision of the ground plane provides a continuous ground sheet and lower inductance path. The symmetry and quality of connector ground interface to the backpanel through the head connector minimizes signal loops, thereby minimizing induced signals into the signal paths.

Although the present invention has been described with reference to preferred embodiments, workers skilled in the art will recognize that changes may be made in form and detail without departing from the spirit and scope of the invention.

What is claimed is:

1. An assembly comprising
   circuit apparatus comprising an integral structure of first and second multilayer wiring board portions connected by an integral flexible circuit portion, each of the multilayer wiring board portions having at least circuit trace planes, ground planes and insulator planes, and the flexible circuit portion having at least one signal trace plane and at least one ground plane separated by at least one insulator plane, the signal trace plane of the flexible circuit portion being integral with a signal trace plane of each of the first and second wiring board portions, the ground plane of the flexible circuit portion being integral with a ground plane of each of the first and second wiring board portions, and the insulator plane of the flexible circuit portion being integral with an insulator plane of each of the first and second wiring board portions, the circuit apparatus further including a plurality of electric contacts, selected ones of said contacts being connected to selected ones of the circuit traces of the circuit trace plane of the flexible circuit portion; and
   connector means supported by the circuit apparatus and electrically connected to the plurality of contacts, the connector means being adapted to electrically connect the selected circuit traces to a backpanel.

2. The apparatus of claim 1 wherein the flexible circuit portion includes first and second signal trace planes, and the electric contacts comprise plated-through holes which extend through the flexible circuit portion and are connected to selected ones, and are insulated from the others, of (i) the signal traces of the first signal trace plane of the flexible circuit portion, (ii) the signal traces of the second signal trace plane of the flexible circuit portion, and (iii) the ground plane of the flexible circuit portion.

3. The apparatus of claim 1 wherein the flexible circuit portion includes a power plane, and the electric contacts comprise plated-through holes which extend through the flexible circuit portion and are connected to selected ones, and are insulated from the others, of (i) the signal traces of the signal trace plane of the flexible circuit portion, (ii) the power plane of the flexible circuit portion, and (iii) the ground plane of the flexible circuit portion.

4. The apparatus of claim 1 further including a heat sink operatively connected to and sandwiched between the first and second wiring board portions, the flexible circuit portion being folded to form a loop between the first and second wiring board portions, wherein the connector means comprises a housing, a plurality of pin contacts supported by the housing and connected to respective ones of the electric contacts, the pin contacts being arranged to electrically connect to mating contact apertures on the backpanel.

5. The apparatus of claim 1 wherein at least one of the contacts is electrically connected to the ground plane of the flexible circuit portion, the connector means being further adapted to electrically connect the ground plane of the flexible circuit portion to the backpanel.

6. The apparatus of claim 5 wherein the electric contacts are arranged in a plurality of rows each having n contacts, where n is an odd integer greater than 1, the contacts connected to the ground plane of the flexible circuit portion being contacts at alternate positions in alternate rows.

7. The apparatus of claim 6 wherein the electric contacts connected to said ground plane are at even positions in first alternate rows and at odd positions in second alternate rows, the first alternate rows alternating with the second alternate rows.

8. The apparatus according to claim 6 the ratio of contacts connected to the signal traces to contacts connected to ground is 6:1.

9. The apparatus of claim 1 wherein the electric contacts comprise plated-through holes which extend through the flexible circuit portion and are connected to selected ones, and are insulated from the others, of (i) the signal traces of the signal trace plane of the flexible circuit portion and (ii) the ground plane of the flexible circuit portion.

10. The apparatus of claim 9 further including a heat sink operatively connected to and sandwiched between the first and second wiring board portions, the flexible circuit portion being folded to form a loop between the first and second wiring board portions, wherein the connector means comprises a housing, a plurality of pin contacts supported by the housing and connected to respective ones of the plated-through holes, the pin contacts being arranged to electrically connect to mating contact apertures on the backpanel.

11. The apparatus of claim 9 further including a heat sink operatively connected to and sandwiched between the first and second wiring board portions, the flexible circuit portion forming a loop between the first and second wiring board portions, the connector means comprises a pressure plate supported by the flexible circuit portion, a plurality of button contacts supported by the flexible circuit portion and electrically connected to respective ones of said plated-through holes, the button contacts being arranged to bear against and electrically contact mating contacts on the backpanel, and bias means biasing against the pressure plate to bias the button contacts to bear against the mating contacts.

12. The apparatus of claim 11 further including extension means supported by the heat sink and extending though the pressure plate and flexible circuit portion, and a flange on the extension means for limiting the travel of the pressure plate.

13. The apparatus of claim 12 wherein the extension means includes means for engaging the backpanel to align the button contacts to the mating contacts.

14. The apparatus of claim 1 further including a heat sink operatively connected to and sandwiched between the first and second wiring board portions, the flexible circuit portion forming a loop between the first and second wiring board portions, the connector means comprises a pressure plate supported by the flexible circuit portion, a plurality of button contacts supported by the flexible circuit portion and electrically connected to respective ones of said electric contacts, the button contacts being arranged to bear against and electrically contact mating contacts on the backpanel, and bias means biasing against the pressure plate to bias the button contacts to bear against the mating contacts.

15. The apparatus of claim 14 further including extension means supported by the heat sink and extending though the pressure plate and flexible circuit portion, and a flange on the extension means for limiting the travel of the pressure plate.

16. The apparatus of claim 15 wherein the extension means includes means for engaging the backpanel to align the button contacts to the mating contacts.

* * * * *

UNITED STATES PATENT AND TRADEMARK OFFICE
CERTIFICATE OF CORRECTION

PATENT NO. : 5,161,986

DATED : November 10, 1992

INVENTOR(S) : GLENN J. GULBRANSON, STEVEN J. YOUNG, GERALD W. KENEALEY

Page 1 of 2

It is certified that error appears in the above-identified patent and that said Letters Patent is hereby corrected as shown below:

On title page, item [56], References Cited add the following:

| | | | |
|---|---|---|---|
| 3,401,369 | 9/1968 | P.H. Palmateer et al......339/17 |
| 3,651,432 | 3/1972 | H. Henschen et al.......333/33 |
| 4,511,196 | 4/1985 | J. Schuler et al..........339/14 R |
| 4,552,420 | 11/1985 | G. Eigenbrode.............339/14 R |
| 4,581,679 | 4/1986 | R. Smolley................361/395 |
| 4,655,518 | 4/1987 | L. Johnson et al..........399/17 |
| 4,692,120 | 9/1987 | D. Feinstein..............439/62 |
| 4,710,133 | 12/1987 | R. Lindeman...............439/92 |
| 4,715,829 | 12/1987 | G. Preputnick.............439/66 |
| 4,755,147 | 7/1988 | S. Young..................439/77 |
| 4,806,110 | 2/1989 | R. Lindeman...............439/108 |
| 4,834,660 | 5/1989 | B. Cotti..................439/67 |
| 4,840,573 | 6/1989 | P. Seidel et al...........439/92 |
| 4,881,901 | 11/1989 | D. Mendenhall et al......439/65 |
| 4,911,643 | 3/1990 | M. Perry et al...........439/67 |

UNITED STATES PATENT AND TRADEMARK OFFICE
CERTIFICATE OF CORRECTION

PATENT NO. : 5,161,986

DATED : November 10, 1992

INVENTOR(S) : Glenn J. Gulbranson, Steven J. Young, Gerald W. Kenealey

It is certified that error appears in the above-indentified patent and that said Letters Patent is hereby corrected as shown below:

OTHER PUBLICATIONS

Cantwell, Dennis, "Technical Report: Rigid-Flex Printed Wiring Boards - Designing Smarter, Not Harder," Printed Circuits, Inc., August 25, 1987.

Signed and Sealed this

Twenty-sixth Day of October, 1993

Attest:

BRUCE LEHMAN

*Attesting Officer*   *Commissioner of Patents and Trademarks*